United States Patent
Uzoh et al.

(10) Patent No.: US 6,600,230 B2
(45) Date of Patent: Jul. 29, 2003

(54) SEEDLAYER FOR PLATING METAL IN DEEP SUBMICRON STRUCTURES

(75) Inventors: Cyprian E. Uzoh, Milpitas, CA (US); Peter S. Locke, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/899,923

(22) Filed: Jul. 9, 2001

(65) Prior Publication Data

US 2001/0046565 A1 Nov. 29, 2001

Related U.S. Application Data

(62) Division of application No. 09/363,741, filed on Jul. 30, 1999, now Pat. No. 6,258,717.

(51) Int. Cl.$^7$ .............................................. H01L 23/48
(52) U.S. Cl. ................. 257/762; 257/758; 257/774; 438/677; 428/209; 428/76
(58) Field of Search ................. 438/618, 622, 438/638, 640, 641, 660, 672, 679, 680, 687, 637, 639, 674, 675, 677, 678; 257/758, 762, 774; 205/169, 291, 574; 428/551, 76, 209

(56) References Cited

U.S. PATENT DOCUMENTS

| | | | | |
|---|---|---|---|---|
| 4,347,108 A | * | 8/1982 | Willis | 205/298 |
| 4,891,259 A | * | 1/1990 | Moran | 428/209 |
| 5,034,257 A | * | 7/1991 | Moran | 428/76 |
| 6,096,648 A | * | 8/2000 | Lopatin et al. | 438/687 |
| 6,319,728 B1 | * | 11/2001 | Bhan et al. | 438/687 |
| 6,376,374 B1 | * | 4/2002 | Stevens | 438/687 |

* cited by examiner

*Primary Examiner*—Matthew Smith
*Assistant Examiner*—Belur V Keshavan
(74) *Attorney, Agent, or Firm*—Connolly Bove Lodge & Hutz, LLP; Joseph P. Abate

(57) ABSTRACT

A process for plating metal in submicron structures. A seedlayer is deposited on surfaces of submicron structures. The seedlayer is annealed at a temperature of about 80° C. to about 130° C. Metal is plated on the seedlayer.

1 Claim, 1 Drawing Sheet

SEEDLAYER FOR PLATING METAL IN DEEP SUBMICRON STRUCTURES

CROSS-REFERENCE TO RELATED APPLICATION

This application is a divisional of U.S. patent application Ser. No. 09/363,741 filed Jul. 30, 1999, now U.S. Pat. No. 6,258,717.

FIELD OF THE INVENTION

The invention relates to semiconductor devices. In particular, the present invention relates to a process for plating a conductive material to a conductive feature in or on a substrate. More particularly, the present invention concerns electroplating metal to fill submicron structures formed in a substrate. The present invention also relates to the metal filled submicron structures.

BACKGROUND OF THE INVENTION

In the production of microelectronic devices, metal may be plated in and on semiconductor structures for a variety of purposes. The metal may be deposited to form vias and/or conductive lines, such as wiring structures. Typically, metal is plated in cells or reservoirs that hold a plating solution that includes at least one metal and/or alloy to be plated on the substrate.

SUMMARY OF THE INVENTION

The present invention provides a process for plating metal in submicron structures. The process includes depositing a seedlayer on surfaces of submicron structures. The seedlayer is annealed at a temperature of about 80° C. to about 130° C. Metal is plated on a seedlayer.

The present invention also provides a process for plating metal in submicron structures. The process includes depositing a seedlayer on surfaces of submicron structures. Metal is plated on a seedlayer and a plating bath that includes about 130 grams per liter to about 155 grams per liter of sulfuric acid.

Furthermore, the present invention provides a process for forming a semiconductor device structure. The process includes providing a layer of electrically insulating material. Submicron structures are formed in the layer of electrically insulating material. A seedlayer is deposited in the submicron structures. The seedlayer is annealed at a temperature of about 80° C. to about 130° C. Metal is plated on the seedlayer.

Still further, the present invention provides a process for forming a semiconductor device structure. The process includes providing a layer of electrically insulating material. Submicron structures are formed in the layer of electrically insulating material. A seedlayer is deposited at least in the submicron structures. Metal is plated on the seedlayer in a plating bath that includes about 130 grams per liter to about 155 grams per liter of sulfuric acid.

Further yet, the present invention provides a semiconductor device structure including an electrically insulating material and submicron structures in the electrically insulating material. A copper-containing, annealed, passivated seedlayer is provided on services within the submicron structures. The seedlayer includes about 5 nm to about 20 nm copper oxide and has a resistivity of about 1.9 $\mu\Omega$ centimeter. Metal is arranged on the seedlayer in the submicron structures.

The present invention also provides semiconductor device structures formed according to the above-described processes. According to other aspects, the present invention provides a seedlayer for plating metal in deep submicron structures. The seedlayer includes a copper-containing, annealed, passivated seedlayer including about 5 nm to about 20 nm copper oxide and having a resistivity of about 1.9 $\mu\Omega$/cm.

The present invention also provides a bath for plating metal in submicron structures. The bath includes about 130 grams per liter to about 155 grams per liter of sulfuric acid. The bath also includes at least additive selected from the group consisting of suppressor additives in an amount of about 1 gram per liter to about 10 grams per liter, brightener additives in an amount of about 1 gram per liter to about 10 grams per liter and alkanol in an amount of about 0.1 gram per liter to about 2.0 grams per liter.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Difficulties have been encountered in depositing metal seedlayers on sidewalls of submicron structures. For example, seedlayers deposited in such structures often will not be continuous. This problem is especially present with deep submicron vias and trenches.

Often, the seedlayer, as well as a barrier film deposited in the submicron structures, tends to be discontinuous on, for example, portions of vias sidewalls adjacent a bottom of a via. Even if this seedlayer is continuous, in these regions, seedlayers may be particularly thin, such as on the order of about 10 Å to about 40 Å. Discontinuous and thin continuous seedlayers are particularly a problem in the plating of copper. The thin or discontinuous seedlayers are easily partially and/or fully oxidized. This may effect the subsequent plating on the seedlayers.

An additional problem associated with thin and/or discontinuous seedlayers is that upon immersion in sulfuric acid based electroplating solutions, the tenuous seedlayers near the bottom of the vias, lines, or other submicron structures may be relatively easily dissolved in the plating bath prior to the onset of plating. This problem may be particularly bad where it is desired that the substrate to be plated sit or dwell in the plating bath for a period of time prior to plating to permit plating solution to migrate into all of the structures to be plated. Dissolving of the seedlayers can create voids at the bottom of lines, vias or other structures to be plated. These voids are highly undesirable and can subsequently result in poor wafer yields.

Figure 1:
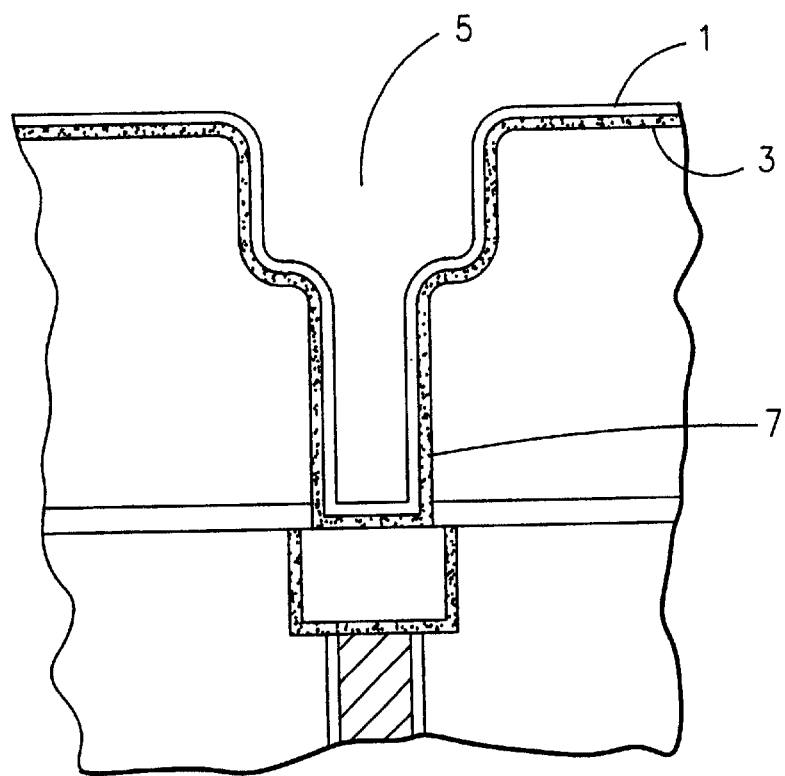
FIG. 1 represents a cross-sectional view of a portion of a known of a semiconductor device structure in the process of forming conductive lines and vias.

FIG. 1 illustrates an example of a typical structure to be plated wherein the above-described problems manifest themselves. FIG. 1 illustrates a seedlayer 1 on a barrier film 3, both of which have been deposited in a opening 5 to be plated. As indicated by region 7, the seedlayer is thin and/or discontinuous near the bottom of the structure to be plated.

Figure 2:
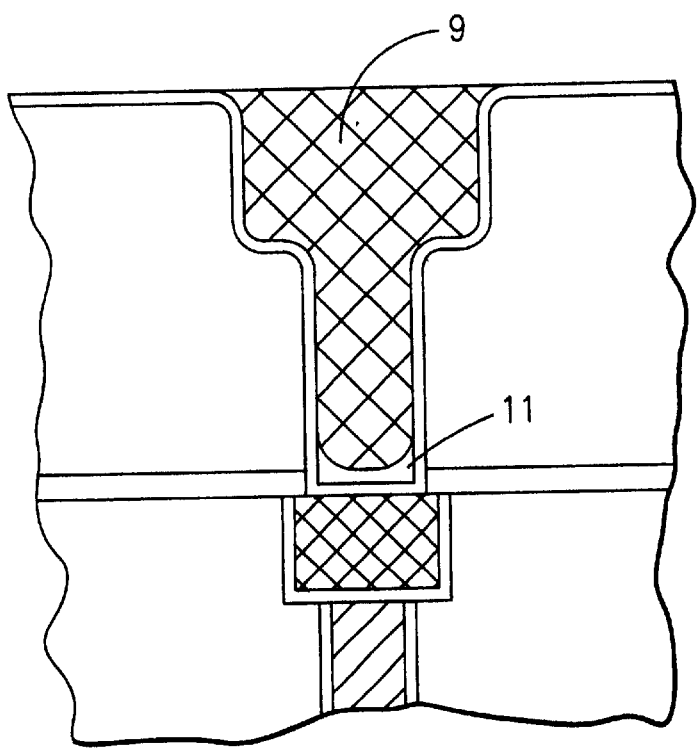
FIG. 2 represents a cross-sectional view of the structure illustrated in FIG. 1 after plating of metal in openings in the structure illustrated in FIG. 1.

As described above, the tenuous seedlayer may be oxidized by air. It may also be subject loss in a plating bath, particularly an $H_2SO_4$ based plating bath. FIG. 2 illustrates the structure illustrated in FIG. 1 after plating of metal 9 in the opening 5. As can be seen, in the vicinity of the bottom of the opening 5, a void 11 has been formed where the seedlayer was thin and/or discontinuous.

The present invention provides a solution to the above-described problems as well as others by helping to provide a robust seedlayer that resists oxidation as well as degradation by the plating bath. The present invention provides a plurality of techniques to address the above-described problems both in forming the seedlayer and/or in the subsequent plating of metal on the seedlayer. As a result, the present invention overcomes the above-described problems.

According to one aspect, the present invention provides a process for plating metal in submicron structures. The process includes depositing a seedlayer on surfaces of the submicron structures. The seedlayer is annealed at a temperature of about 80° C. to about 130° C. Metal is plated on the seedlayer.

The annealing may take place as the seedlayer is being deposited or subsequent to deposition of the seedlayer. Whether the seedlayer is annealed during or subsequent to deposition, the seedlayer may be deposited by sputtering.

The annealing of the seedlayer may represent a departure from known processes. Additionally, carrying out the annealing at a temperature of about 80° C. to about 130° C. may also represent a departure from typical annealing processes. Along these lines, annealing typically takes place at greater temperatures.

While the annealing according to the present invention typically is carried out at a temperature of about 80° C. to about 130° C., the annealing may also take place at a temperature of less than about 120° C. Regardless of the annealing temperature utilized, the annealing temperature may be controlled to control the resistivity of the resulting seedlayer. For example, the annealing temperature may be sufficient to result in a seedlayer having a resistivity of about 1.9 $\mu\Omega$ per centimeter.

The annealing of the seedlayer may be carried out by ensuring that the substrate that the seedlayer is to be deposited on is at a elevated temperature, such as the temperatures described above prior to deposition of the seedlayer.

According to another aspect, the seedlayer and the substrate that the seedlayer is deposited on may be at an elevated temperature prior to plating the metal on the seedlayer. Typically, the temperature is about 80° C. to about 130° C. However, any temperature above room temperature may be utilized. Along these lines, the temperature may be up to about 80° C. or up to about 130° C.

According to an additional aspect, during or subsequent to deposition of the seedlayer, the seedlayer or material to form a seedlayer may be exposed to at least one of $H_2$ gas and/or a forming gas. Along these lines, exposure to the $H_2$ and/or forming gas may take place before, during and/or after the annealing period. Any suitable process parameters, such as process time, pressure, temperature, flow rate, and partial pressure may be utilized in the exposure to the $H_2$ and/or forming gas. According to one specific example, about 10 standard liters per minute (SLM) of $H_2$ and/or forming gas are utilized for about 30 to about 60 minutes at a temperature of about 80° C. to about 130° C.

The seedlayer may be exposed to $H_2$ and/or forming gas in amounts, and under conditions sufficient to result in a residual amount of hydrogen in the seedlayer after exposure to the $H_2$ gas to result in passivation of the seedlayer. Additionally and/or alternatively, the gas, amounts, and conditions of exposure to the gas may be sufficient to result in a seedlayer having a resistivity of about 1.9 $\mu\Omega$ per centimeter. Alternatively, the temperature that the annealing is carried out at and the gas or gases that the seedlayer is exposed to, including amounts and conditions of the exposure are sufficient to result in the seedlayer having a resistivity of about 1.9 $\mu\Omega$ centimeter.

Typically, seedlayers have resistivity of about 2.4$\mu\Omega$ per centimeter. Therefore, as described above, the present invention can result in a lowering of the resistivity of the film. Lowering film resistivity can enhance holefill.

Additionally, as described above, the annealing temperatures utilized in the present invention are lower than typical annealing temperatures. This lower annealing temperature may help to reduce copper oxide in the sputtered film. Lower annealing temperatures may not result in any significant agglomeration of the seedlayer.

Also, passivation of the seedlayer by residual amounts of hydrogen remaining after cool down and removal of substrate from hydrogen atmosphere can reduce the subsequent oxidation rate of the seedlayer.

Additionally or alternatively to the annealing, gas exposure, and other aspects of the present invention described above, a seedlayer whether formed as described above or not may be subjected to a new plating bath according to the present invention. A plating bath according to the present invention, in addition to including the metal to be plated and possibly other components, comprises about 130 grams per liter to about 155 grams per liter of sulfuric acid. On the other, typical know plating baths include about 160 grams per liter to about 200 grams per liter of sulfuric acid.

Therefore, the plating bath according to the present invention includes a lower sulfuric acid concentration than typical sulfuric acid concentrations in plating baths. The composition of the plating bath according to the present invention can help to reduce copper etch rate during dwell prior to application of power to a substrate and plating of the metal or metals.

The plating bath according to the present invention may also have a lower oxygen concentration that typically utilized plating baths. Typically, the oxygen concentration in the bath is about $10^{-3}$ to about $10^{-5}$ moles per liter. The lower oxygen concentration may also help to reduce etching of the seedlayer, particularly in sub-micron structures where the seedlayer may be thin or discontinuous. Oxygen concentration may be measured and controlled by detecting the dissolution rate of copper and based upon known values. Those of ordinary skill in the art, once aware of the present disclosure, would be able to determine appropriate oxygen values to result in the plating bath having certain characteristics without undue experimentation.

The copper seedlayer etching in the modified bath according to the present invention may be further reduced by the addition of one or more additives that can help to suppress the etch rate of large copper grains in the presence of sulfuric acid. The additives can include one or more surfactants.

The additives can include additives in the generic classes of suppressing additives and/or brightener additives. Those of ordinary skill in the art understand the meaning of suppressing and brightening additives and can determine appropriate additives to include in the plating bath without undue experimentation once aware of the present disclosure. Both classes of additives can also include surfactants.

The amount of suppressor additives and/or brightener additives may vary, depending upon the embodiment. Typically, the plating bath includes about 1 gram per liter to about 10 grams per liter of suppressor additives and/or about 1 gram per liter to about 10 grams per liter of brightener additives. Typically only one type of additive is added to the plating bath.

A plating bath according to the present invention may alternatively and/or additionally include alkanol. The amount of alkanol may vary depending upon the embodiment. According to typical embodiments, a plating bath according to the present invention includes from about 0.1 gram per liter to about 2.0 grams per liter of alkanol. Typically, the alkanol is used in addition to the other additives, independent of the amount of the other additives utilized.

As stated above, the present invention may include the new plating bath, in addition to or alternatively to the annealing and other aspects of the deposition of the seedlayer described above. The annealing process and/or plating bath of the present invention may provide elements of an overall process for forming semiconductor device structures. Along these lines, the present invention may include any one number of steps involved in semiconductor device manufacturing.

A process for forming a semiconductor device structure according to the present invention at least includes providing a layer of electrically insulating material on a substrate. Submicron structures are formed in the layer of electrically insulating material. A seedlayer is deposited in the submicron structures and metal plated on the seedlayer. The seedlayer may be deposited as described above. Additionally, the plating that the metal may take place in a bath as described above. The process includes one or both of the seedlayer deposition and processing and the plating bath.

The present invention also includes a semiconductor device structure. Semiconductor device structure includes an electrically insulating material on a substrate and submicron structures in the electrically insulating material. A copper-containing, annealed, passivated seedlayer may be arranged on surfaces within the submicron structures. The seedlayer includes about 5 nm to about 20 nm copper oxide and has a resistivity of about 1.9 $\mu\Omega$ centimeter. Metal is arranged in the submicron structures on the seedlayer. The submicron structures may include at least one of vias lines.

The present invention also includes a seedlayer for plating metal in deep submicron structures. The seedlayer includes a copper-containing, annealed, passivated seedlayer including about 5 nm to about 20 nm copper oxide and having a resistivity of 1.9 $\mu\Omega$ centimeter. The present invention also includes a plating bath as described above.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A seedlayer for plating metal in deep submicron structures, comprising:
   a copper-containing, annealed, passivated seedlayer including about 5 nm to about 20 nm copper oxide and having a resistivity of about 1.9 $\mu\Omega$cm.

* * * * *